United States Patent [19]
Sato

[11] Patent Number: 5,804,989
[45] Date of Patent: Sep. 8, 1998

[54] LOGIC CIRCUIT FOR A SEMICONDUCTOR MEMORY DEVICE

[75] Inventor: Fumihiko Sato, Tokyo, Japan

[73] Assignee: NEC Corporation, Tokyo, Japan

[21] Appl. No.: 627,343

[22] Filed: Apr. 1, 1996

[30] Foreign Application Priority Data

Mar. 30, 1995 [JP] Japan ................................ 7-073107

[51] Int. Cl.⁶ ........................................... H03K 19/0948
[52] U.S. Cl. ............................ 326/108; 326/17; 326/121
[58] Field of Search .................................. 326/105–106, 326/108, 17, 112, 119, 121

[56] References Cited

U.S. PATENT DOCUMENTS

| | | | |
|---|---|---|---|
| 4,404,474 | 9/1983 | Dingwall | 326/106 |
| 4,571,510 | 2/1986 | Seki et al. | 326/98 |
| 5,274,278 | 12/1993 | Bauer et al. | 326/106 |
| 5,387,827 | 2/1995 | Yokoyama et al. | 326/106 |

OTHER PUBLICATIONS

Rhyne. Fundamentals of Digital Systems Design. Prentice Hall, NJ pp. 70–71, 1973.
Horenstein. Microelectronic Circuits and Devices. Prentice Hall, NJ. pp. 753–755, 1990.

*Primary Examiner*—Jon Santamauro
*Attorney, Agent, or Firm*—Sughrue, Mion, Zinn, Macpeak & Seas, PLLC

[57] ABSTRACT

In a logic circuit including a NAND type or a NOR type decoder, a p-MOS type transistor for precharge or an n-MOS type transistor for discharge is connected to a common node. The transistor allows precharge or discharge to be completed in a short period of time by promoting the charging or discharging of stray capacitances. Therefore, the circuit reduces the period of time necessary for the decoder to produce a high level output or a low level output.

4 Claims, 7 Drawing Sheets

LOGIC CIRCUIT FOR A SEMICONDUCTOR MEMORY DEVICE

BACKGROUND OF THE INVENTION

The present invention relates to a logic circuit for a semiconductor memory device and, more particularly, to a logic circuit including a decoder.

A semiconductor memory device using a logic circuit including a NAND type decoder is conventional. The NAND type decoder of this kind of logic circuit has a plurality of NAND gates connected in parallel. The NAND gates are each implemented as bi-input NAND gate having two input terminals and a single output terminal. One of the two input terminals is shared by all the NAND gates. An output selectively appears on the output terminals of the NAND gates in accordance with the logical levels of select signals applied to the input terminals.

The problem with the conventional logic circuit of the type described is that a substantial period of time is necessary for an output to appear on the selected output terminal of the NAND gates.

SUMMARY OF THE INVENTION

It is therefore an object of the present invention to provide a logic circuit including a decoder and capable of reducing a period of time necessary for an output thereof to appear.

In accordance with the present invention, in a logic circuit including a NAND type decoder, the NAND type decoder has a plurality of parallel NAND gates. Each NAND gate has a normally conductive p-MOS type transistor which is a load, a first n-MOS type transistor having a drain terminal thereof connected to a drain terminal of the p-MOS type transistor, and a second n-MOS type transistor having a drain terminal thereof connected to the source terminal of the first n-MOS type transistor. The source terminal of the first n-MOS type transistors included in the NAND gates are commonly connected to the drain terminal of the second n-MOS transistor. In each NAND gate, a junction where the drain terminal of the first n-MOS transistor and the drain terminal of the p-MOS type transistor are connected constitutes the output terminal of the NAND gate. A first switching element is connected between the drain terminal of the second n-MOS type transistor and the highest source potential and for charging the second n-MOS type transistor.

Also, in accordance with the present invention, in a logic circuit including a NOR type decoder, the NOR type decoder has a plurality of parallel NOR gates. Each NOR gate has a normally conductive n-MOS type transistor which is a load, a first p-MOS type transistor having one conductive layer thereof connected to one conductive layer of the n-MOS type transistor, and a second p-MOS type transistor having one conductive layer thereof connected to the other conductive layer of the first p-MOS type transistor. The other conductive layers of the first p-MOS type transistors included in the NOR gates are commonly connected to the one conductive layer of the second p-MOS transistor. In each NOR gate, a junction where the one conductive layer of the first p-MOS transistor and the one conductive layer of the n-MOS type transistor are connected constitutes the output terminal of the NOR gate. A first switching element is connected between the one conductive layer of the second p-MOS type transistor and the highest source potential and for charging the second p-MOS type transistor.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
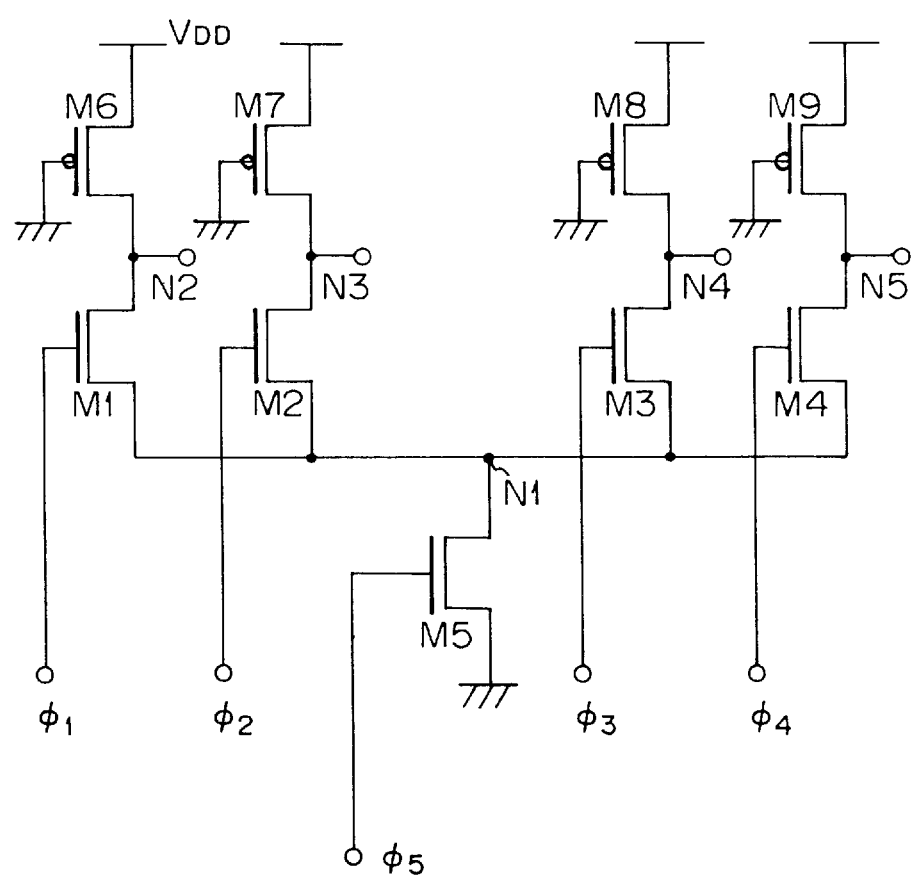
FIG. 1 is a circuit diagram showing a conventional logic circuit including a NAND type decoder and constituting a semiconductor memory device.

To better understand the present invention, a brief reference will be made to a conventional logic circuit including a NAND type decoder, shown in FIG. 1. As shown, the logic circuit has n-MOS (Metal Oxide Semiconductor) type transistors M1–M5, and p-MOS type transistors M6–M9. The source terminals of transistors M6–M9 are connected to a highest source potential VDD. The source of the transistor M1 is connected to the drain of the transistor M5 at a node N1. The source of the transistor M5 is connected to ground. The transistors M1 and M5 have their gates respectively connected to input terminals to which select signals $\phi 1$ and $\phi 5$ are input. A junction at which the drains of the transistors M1 and M6 are connected is connected to a n output terminal N2. In this configuration, the transistors M1, M6 and M5 constitute a so-called bi-input NAND gate.

The transistors M2, M7 and M5 constitute another bi-input NAND gate while the transistors M3, M8 and M5 and transistors M4, M9 and MS each constitutes still another biinput NAND gate. The gate of the transistor M2 is connected to an input terminal to which a select signal $\phi 2$ is input. A junction at which the drains of the transistors M2 and M7 are connected is connected to an output terminal N3. The gate of the transistor M3 is connected to an input terminal at which a select signal $\phi 3$ arrives. A junction at which the drains of the transistors M3 and M8 are connected is connected to an output terminal N4. Further, the gate of the transistor M4 is connected to an input terminal at which a select signal $\phi 4$ arrives. A junction at which the drains of the transistors M4 and M9 are connected is connected to an output terminal N5. The sources of the transistors M2, M3 and M4 are also connected to the drain of the transistor M5 at the node N1.

In the above logic circuit, assume that only one of the select signals $\phi 1$–$\phi 4$ is in a high level in potential, and that the select signal $\phi 5$ is in a high level. Then, one of the NAND gates receiving the select signal $\phi 1$, $\phi 2$, $\phi 3$ or $\phi 4$ of high level is selected and outputs a low level via its output terminal. When the select signal $\phi 5$ is in a low level, none of the NAND gates is selected, i.e., all the NAND gates output a high level. For example, if the select signals $\phi 1$ and $\phi 5$ are in a high level, then the NAND gate consisting of the transistors M1, M6 and M5 and connected to the output terminal N2 is selected. At this instant, because all the transistors M1, M6 and M5 are conductive, the set current ability of the transistor M6 must be small in order that the output terminal N2 be in a low level.

In the above specific case, in the event of precharge or non-selected condition, either the select signal $\phi 1$ or the select signal $\phi 5$ goes low while the output terminal N2 goes high. However, the small current ability of the transistor M6 as mentioned above brings about the following problem. Particularly, when the select signal $\phi 5$ goes high, a substantial period of time is necessary for the output terminal N2 to go high because there must be charged a great parasitic capacitance corresponding to the diffusion capacitance of the transistors M1 and M6 connected to the output terminal N and the drain capacitance of the transistor M5. For example, to reduce the high level potential at the time of selection to one-fifth of the source potential, it is necessary to reduce the current ability of the associated p-MOS transistor to one-fifth. As a result, the period of time necessary for the output to go high is five times the period of time available with an ordinary inverter device.

Preferred embodiments of the logic circuit in accordance with the present invention will be described hereinafter. In the embodiments, the same constituents as the constituents shown in FIG. 1 are designated by like reference numerals.

Figure 2:
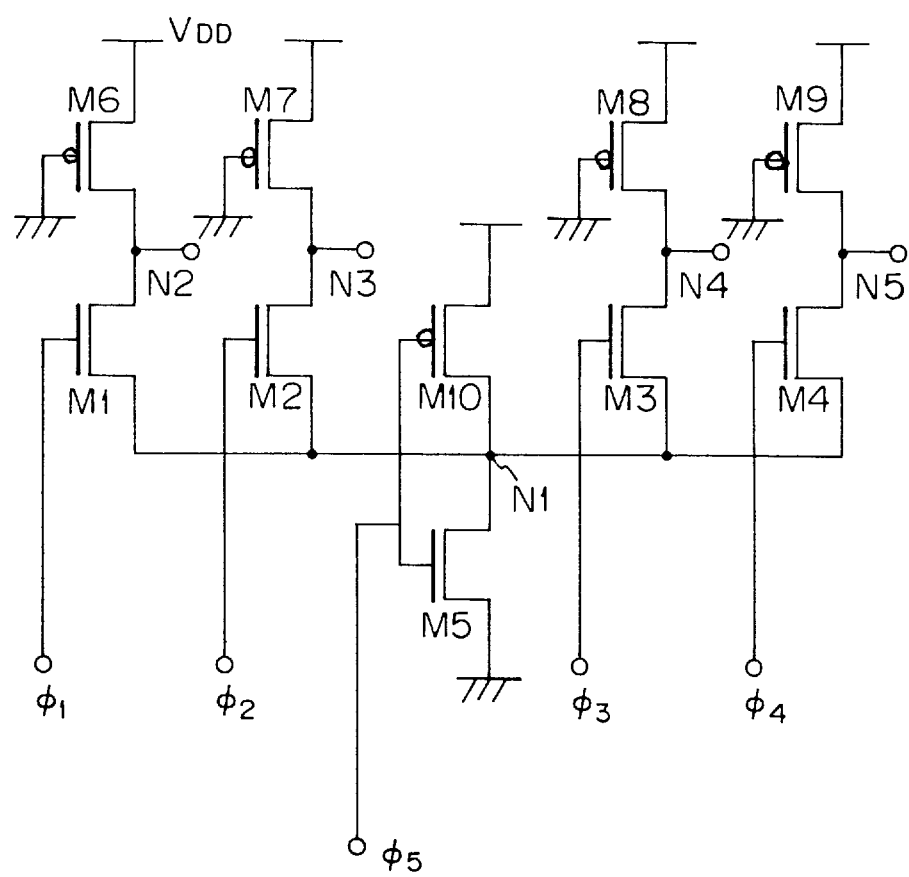
FIGS. 2–8 are circuit diagrams respectively representative of a first embodiment to a seventh embodiment of the present invention.

Referring to FIG. 2, a first embodiment of the present invention is shown. As shown, a logic circuit has n-MOS type transistors M1–M5, and p-MOS type transistors M6–M9. The transistors M6–M9 each normally remains conductive with the respective source, or one of two conductive layers thereof, connected to the highest source potential VDD. The source of the transistor M1 is connected to the drain of the transistor M5 at a node N1. The source of the transistor M5 is connected to ground. The transistors M1 and M5 have their gates respectively connected to input terminals to which select signals $\phi 1$ and $\phi 5$ are input. A junction at which the drains of the transistors M1 and M6 are connected is connected to a n output terminal N2. In this configuration, the transistors M1, M6 and M5 constitute a so-called bi-input NAND gate.

The transistors M2, M7 and M5 constitute another bi-input NAND gate while the transistors M3, M8 and M5 and transistors M4, M9 and M5 each constitute still another bi-input NAND gate. These NAND gates are connected to input terminals at which select signals $\phi 2$, $\phi 3$, $\phi 4$ and $\phi 5$ arrive and output terminals N3, N4 and N5 in the same manner as in the conventional circuit shown in FIG. 1. In the illustrative embodiment, a p-MOS type transistor M10 for precharge has its drain connected to the node N1. The source of the transistor M10 is connected to the highest source potential VDD.

Again, assume that only one of the select signals $\phi 4-\phi 4$ is in a high level in potential, and that the select signal $\phi 5$ is in a high level. Then, one of the NAND gates receiving the select signal $\phi 1$, $\phi 2$, $\phi 3$ or $\phi 4$ of high level is selected and outputs a low level via its output terminal. When the select signal $\phi 5$ is in a low level, none of the NAND gates is selected, i.e., all the NAND gates output a high level. Let the following description concentrate on the NAND gate having the output terminal N2 by way of example.

So long as the select signal $\phi 5$ is fixedly held in a high level while the select signal $\phi 1$ is used to control the input, the embodiment operates in the same manner as the conventional circuit because the precharge transistor M10 remains nonconductive. On the other hand, assume that the signal $\phi 1$ is fixedly held in a high level while the select signal $\phi 5$ is used to control the input, i.e., the output is in a low level. Then, because the select signal $\phi 5$ is in a high level and because the transistor M10 is nonconductive, the embodiment operates in the same manner as the conventional circuit. However, when the output is in a high level, because the select signal $\phi 5$ is in a low level and because the transistor M10 is rendered conductive, the transistors M6 and M10 both charge stray capacitances, i.e., a wiring capacitance between the drains of the transistors M1–M4 and the source of the transistor M5, a junction capacitance particular to the transistors M1–M5, and a gate capacitance particular to the transistor M1. This completes precharge in a short period of time, compared to the conventional circuit which turns on only the transistor M6 having a low ability.

There is some fear that the addition of the p-MOS transistor M10 delays the input due to the increase in input capacitance. However, this does not matter at all when it comes to a semiconductor integrated circuit in which the delay of input and output is dependent more on the wiring capacitance than on the gate capacitance. Specifically, when the embodiment was applied to a column address selecting section for a 1M SRAM (Static Random Access Memory), the interval between the selection of an address and the actual determination of a column address was found to be reduced by about 5%.

Figure 3:
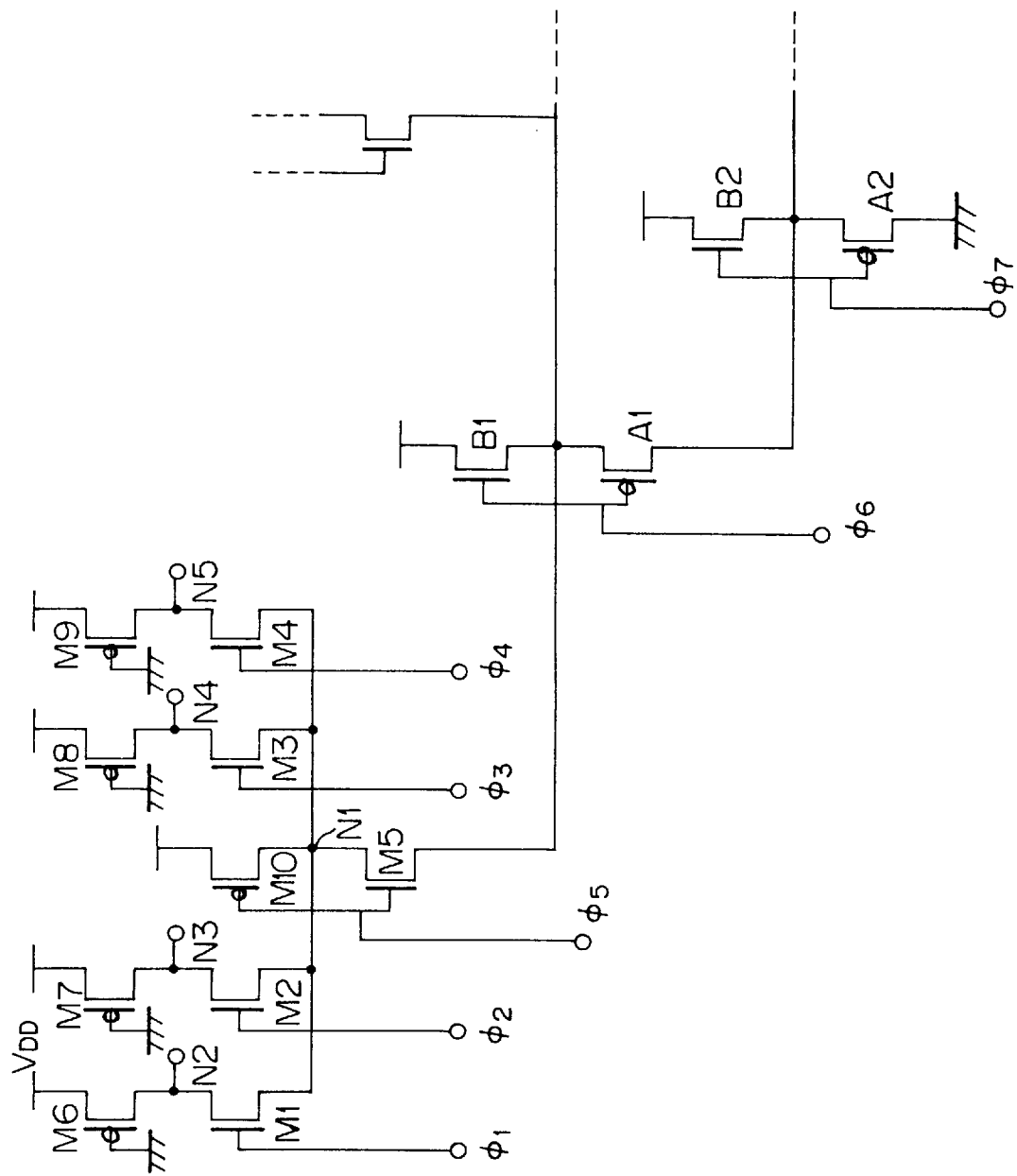

FIG. 3 shows a second embodiment of the present invention. As shown, this embodiment is similar to the first embodiment except that it has multiple inputs, i.e., additional n-MOS type transistors A1 and A2 and p-MOS type transistors B1 and B2 for precharge. With this configuration, it is possible to complete precharge in a short period of time even with additional select signals $\phi 6$ and $\phi 7$. Hence, this embodiment broadens the applicable range of the present invention.

Figure 4:
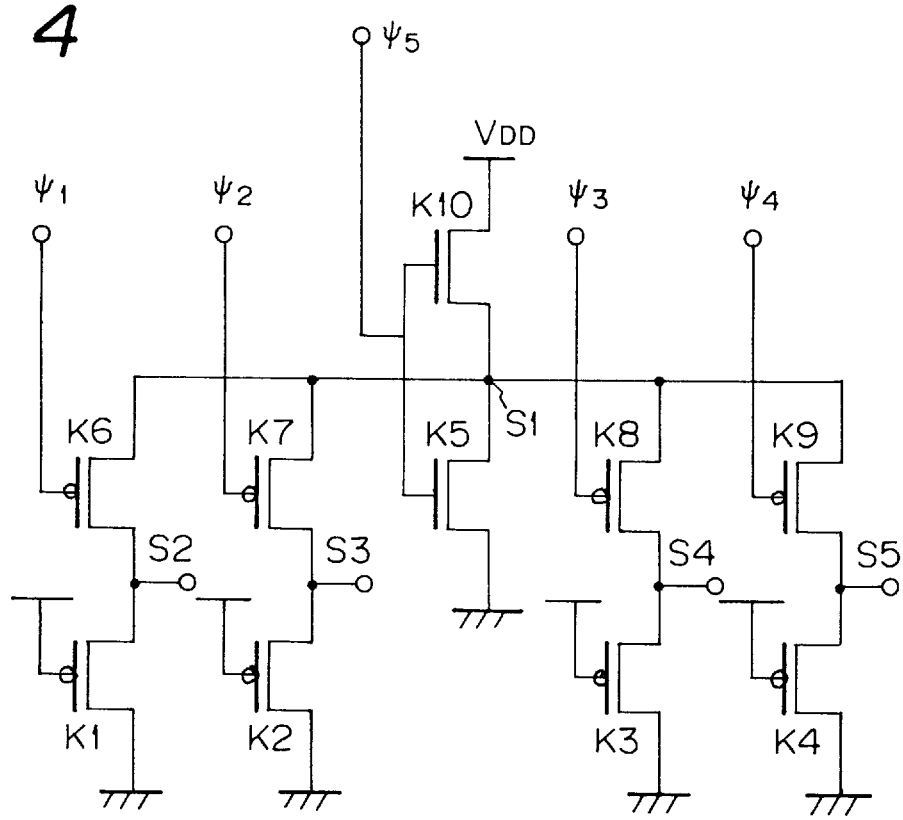

FIG. 4 shows a third embodiment of the present invention in which the n-MOS type transistors of the first embodiment are replaced with p-MOS type transistors in order to implement a NOR type decoder. As shown, an n-MOS type transistor K5 for discharge is substituted for the p-MOS type transistor M10 of the first embodiment and connected to a node S1. When a biinput NOR gate consisting of transistors K1, K6 and K10 is selected, select signals $\psi 1$ and $\psi 5$ are respectively in a low level and a high level with the result that a low level output is produced. At this instant, the additional transistor K5 connected to the node S1 and having a high ability discharges the stray capacitances in cooperation with the transistor K1. This successfully completes discharge in a short period of time.

Figure 5:
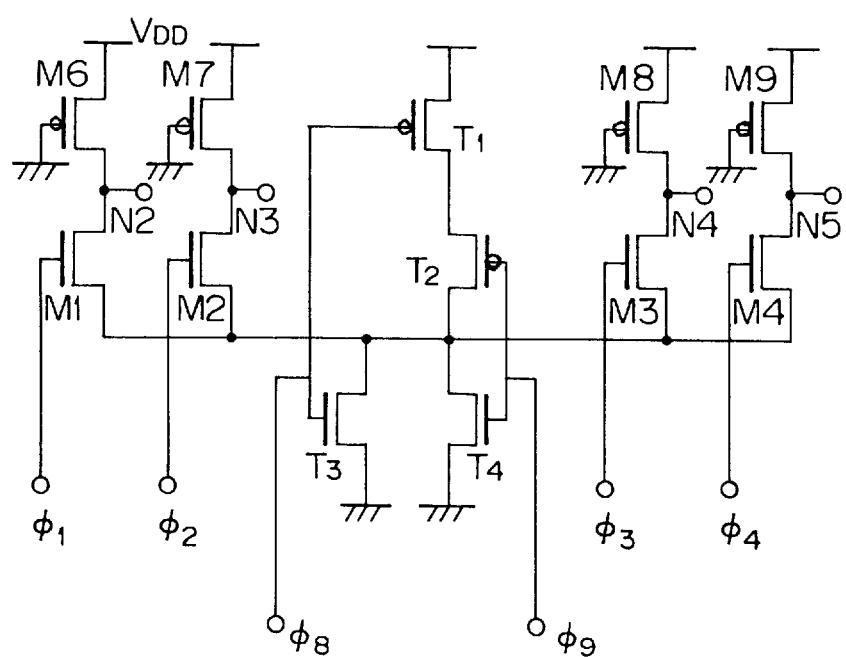

FIG. 5 shows a fourth embodiment of the present invention including p-MOS type transistors for precharge. As shown, p-MOS type transistors T1 and T2 and n-MOS type transistors T3 and T4 constitute a NOR gate. The transistors T1 and T2 charge the stray capacitances. In this case, the precharge ends in a shorter period of time than in the case relying only on a normally conductive p-MOS type transistor. This embodiment allows another logic circuit having a p-MOS transistor for precharge to be included in a decoder.

Figure 6:
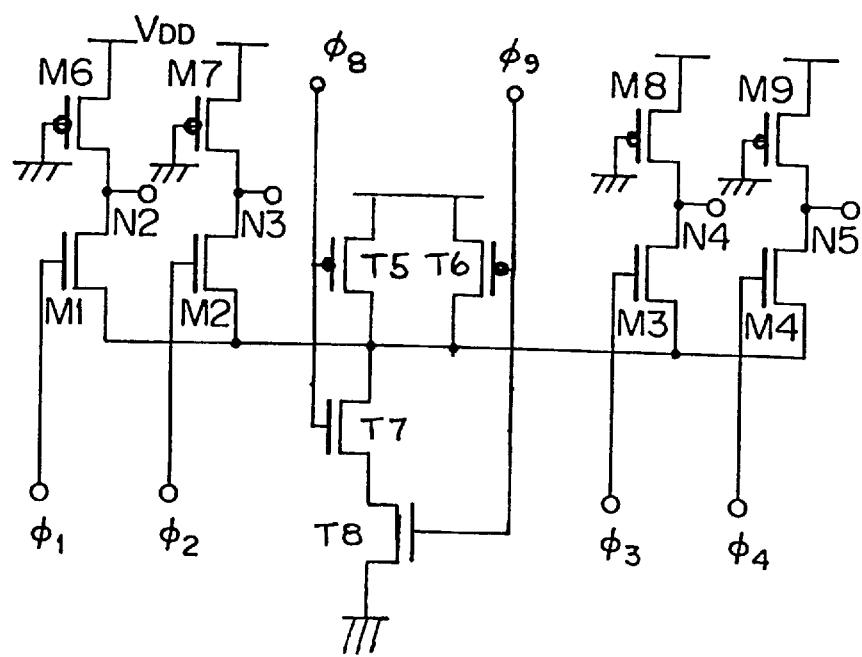
Figure 7:
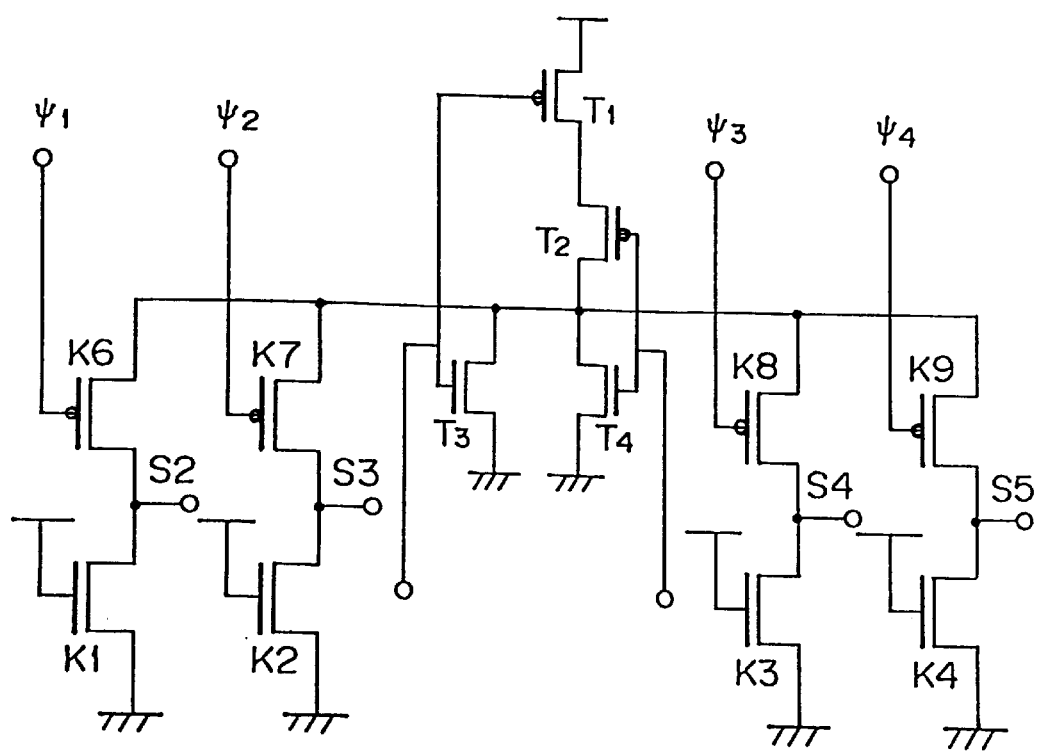

Referring to FIG. 6, a NAND gate circuit is substituted for the NOR gate circuit of the fourth embodiment as illustrated in FIG. 5. Here, n-MOS transistors T5 and T6 and p-MOS transistors T7 and T8 form a NAND gate circuit.

Referring to FIG. 6, a NOR gate circuit is substituted for the n-MOS type transistor K5 and the p-MOS type transistor K10 of the NOR decoder of FIG. 4. Here, p-MOS transistors T1 and T2 and n-MOS transistors T3 and T4 form a NOR gate circuit.

Figure 8:
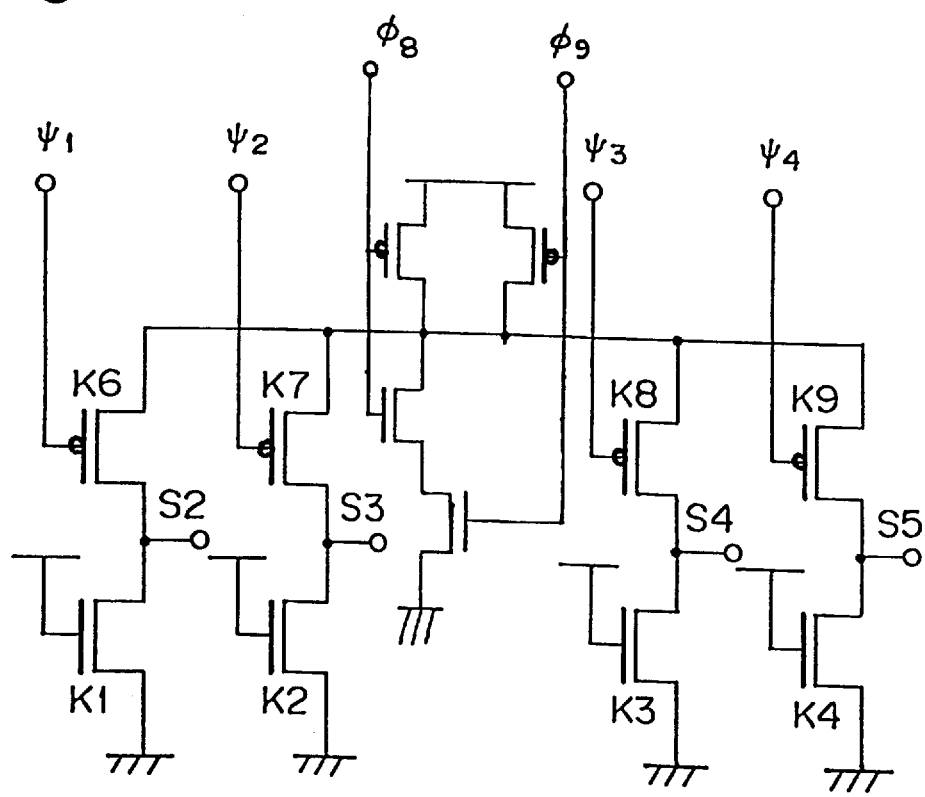

Referring to FIG. 8, a NAND gate circuit is substituted for the n-MOS type transistor K5 and the p-MOS type transistor K10 of the NOR decoder of FIG. 4. Here, n-MOS transistors T5 and T6 and p-MOS transistors T7 and T8 form a NAND gate circuit.

In summary, in accordance with the present invention, a logic circuit has a p-MOS type transistor for precharge or an n-MOS type transistor for discharge connected to a common node. Such a transistor allows precharge or discharge to be completed in a short period of time by promoting the charging or discharging of stray capacitances. Therefore, the circuit reduces the period of time necessary for a decoder to produce a high level output or a low level output. For example, even when the current ability of a p-MOS type transistor, which is a load, is reduced to one-fifth, a precharge time comparable with a precharge time particular to an inverter element is achievable if the remaining four-fifths of the current ability is made up for by the additional switching element.

Various modifications will become possible for those skilled in the art after receiving the teachings of the present disclosure without departing from the scope thereof.

What is claimed is:

1. A logic circuit including a NAND type decoder, said NAND type decoder comprising:

a plurality of parallel NAND gates each comprising a normally conductive p-MOS type transistor which is a load and a first n-MOS type transistor having a drain terminal thereof connected to a drain terminal of said p-MOS type transistor, wherein said first n-MOS type transistor included in each of said plurality of NAND gates has a source terminal which is commonly connected to a drain terminal of a second n-MOS transistor and a drain terminal of a third n-MOS transistor, and wherein each of said plurality of NAND gates includes a junction where said drain terminal of said first n-MOS transistor and said drain terminal of said p-MOS type transistor are connected to form an output terminal of said NAND gate; and a first switching element having a drain terminal connected to said drain terminals of said second and third n-MOS type transistors, and a second switching element connected between a source terminal of said first switching element and a highest source potential, said first and second switching elements and said second and third n-MOS type transistors constituting a NOR gate.

2. A logic circuit including a NAND type decoder, said NAND type decoder comprising:

a plurality of parallel NAND gates each comprising a normally conductive p-MOS type transistor which is a load and a first n-MOS type transistor having a drain terminal thereof connected to a drain terminal of said p-MOS type transistor, wherein said first n-MOS type transistor included in each of said plurality of NAND gates has a source terminal which is commonly connected to a drain terminal of a second n-MOS transistor and a third n-MOS transistor connected between a source terminal of said second n-MOS type transistor and a lowest source potential, and wherein each of said plurality of NAND gates includes a junction where said drain terminal of said first n-MOS transistor and said drain terminal of said p-MOS type transistor are connected to form an output terminal of said NAND gate; and first and second switching elements each having drain terminal connected to said drain terminal of said second n-MOS type transistor, said first and second switching elements and said second and third gate.

3. A logic circuit including a NOR type decoder, said NOR type decoder comprising:

a plurality of parallel NOR gates each comprising a normally conductive n-MOS type transistor which is a load and a first p-MOS type transistor having a drain terminal thereof connected to a drain terminal of said n-MOS type transistor, wherein said first p-MOS type transistor included in each of said plurality of NOR gates has a source terminal which is commonly connected to a drain terminal of a second p-MOS transistor and a drain terminal of a third p-MOS transistor, and wherein each of said plurality of NOR gates includes a junction where said drain terminal of said first p-MOS transistor and said drain terminal of said n-MOS type transistor are connected to form an output terminal of said NOR gate; and a first switching element having a drain terminal connected to said drain terminals of said second and third p-MOS type transistors, and a second switching element connected between a source terminal of said first switching element and a lowest source potential, said first and second switching elements and said second and third p-MOS type transistors constituting a NAND gate.

4. A logic circuit including a NOR type decoder, said NOR type decoder comprising:

a plurality of parallel NOR gates each comprising a normally conductive n-MOS type transistor which is a load and a first p-MOS type transistor having a drain terminal thereof connected to a drain terminal of said n-MOS type transistor, wherein said first p-MOS type transistor included in each of said plurality of NOR gates has a source terminal which is commonly connected to a drain terminal of a second p-MOS transistor and a third p-MOS transistor connected between a source terminal of said second p-MOS type transistor and a highest source potential, and wherein each of said plurality of NOR gates includes a junction where said drain terminal of said first p-MOS transistor and said drain terminal of said n-MOS type transistor are connected to form an output terminal of said NOR gate; and first and second switching elements each having a drain terminal connected to said drain terminal of said second p-MOS type transistors, said first and second switching elements and said second and third p-MOS type transistors constituting a NOR gate.

* * * * *